(12) United States Patent
Liu et al.

(10) Patent No.: US 11,373,429 B2
(45) Date of Patent: Jun. 28, 2022

(54) FINGERPRINT RECOGNITION SUBSTRATE, FINGERPRINT RECOGNITION APPARATUS AND METHOD FOR FABRICATING THE SAME, FINGERPRINT RECOGNITION METHOD, AND DISPLAY DEVICE

(71) Applicant: BOE TECHNOLOGY GROUP CO., LTD., Beijing (CN)

(72) Inventors: Libin Liu, Beijing (CN); Hao Zhang, Beijing (CN); Shuai Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 322 days.

(21) Appl. No.: 16/607,341

(22) PCT Filed: Feb. 18, 2019

(86) PCT No.: PCT/CN2019/075329
§ 371 (c)(1),
(2) Date: Oct. 22, 2019

(87) PCT Pub. No.: WO2019/233122
PCT Pub. Date: Dec. 12, 2019

(65) Prior Publication Data
US 2021/0365657 A1  Nov. 25, 2021

(30) Foreign Application Priority Data
Jun. 5, 2018  (CN) .......................... 201810568932.4

(51) Int. Cl.
*G06V 40/13* (2022.01)
*H01L 27/146* (2006.01)

(52) U.S. Cl.
CPC .... *G06V 40/1318* (2022.01); *H01L 27/14629* (2013.01)

(58) Field of Classification Search
None
See application file for complete search history.

(56) References Cited

U.S. PATENT DOCUMENTS

2017/0052422 A1* 2/2017 Kazlas .................... G02F 1/167
2018/0005007 A1   1/2018 Du et al.
(Continued)

FOREIGN PATENT DOCUMENTS

CN    105336751 A    2/2016
CN    106096595 A    11/2016
(Continued)

OTHER PUBLICATIONS

"First Office Action and English language translation", CN Application No. 201810568932.4, dated Oct. 23, 2020, 19 pp.
(Continued)

*Primary Examiner* — Joseph R Haley
(74) *Attorney, Agent, or Firm* — Myers Bigel, P.A.

(57) ABSTRACT

A fingerprint recognition substrate, a fingerprint recognition apparatus, a manufacturing method thereof, a fingerprint recognition method, and a display device are provided. The fingerprint recognition substrate includes a base substrate including a plurality of pixel regions and a region between the plurality of pixel regions, a first electrode in the plurality of pixel regions, a light emitting layer at least in the plurality of pixel regions, and a second electrode at least in the plurality of pixel regions, and at least a plurality of light transmission holes penetrating the first electrode. At least one light transmission hole is in the region between the plurality of pixel regions, and the plurality of light transmission holes are configured to be optically coupled to a photosensor.

20 Claims, 3 Drawing Sheets

(56) References Cited

U.S. PATENT DOCUMENTS

| | | | |
|---|---|---|---|
| 2018/0219058 A1 | 8/2018 | Xiang et al. | |
| 2019/0049631 A1* | 2/2019 | Lin | G02B 5/005 |
| 2019/0065809 A1 | 2/2019 | Li et al. | |
| 2019/0102016 A1* | 4/2019 | Kim | G02F 1/133553 |
| 2019/0130155 A1* | 5/2019 | Park | H01L 27/3211 |
| 2019/0172887 A1 | 6/2019 | Sun et al. | |
| 2019/0236327 A1 | 8/2019 | Jia et al. | |
| 2019/0362672 A1* | 11/2019 | Cui | G06K 9/0004 |

FOREIGN PATENT DOCUMENTS

| | | |
|---|---|---|
| CN | 106292108 A | 1/2017 |
| CN | 106992202 A | 7/2017 |
| CN | 107122750 A | 9/2017 |
| CN | 107133613 A | 9/2017 |
| CN | 107977632 A | 5/2018 |
| CN | 108010947 A | 5/2018 |
| CN | 108052930 A | 5/2018 |

OTHER PUBLICATIONS

Yang, Deren, et al., "Collected papers of the 10th China Solar Photovoltaic Conference, Edition 1", Zhejiang University Press, Hang Zhou, Zhe Jiang, CN, Sep. 1, 2008, 5 pp.

Zhao, Jianyong, "Organic light emitting diode (OLED) display technology, Edition 1", National Defense Industry Press, Beijing, China, Jul. 1, 2012, 6 pp.

* cited by examiner

FINGERPRINT RECOGNITION SUBSTRATE, FINGERPRINT RECOGNITION APPARATUS AND METHOD FOR FABRICATING THE SAME, FINGERPRINT RECOGNITION METHOD, AND DISPLAY DEVICE

RELATED APPLICATION

The present application is a 35 U.S.C. 371 national stage application of PCT International Application No. PCT/CN2019/075329, filed on Feb. 18, 2019, which claims the benefit of the Chinese Patent Application No. 201810568932.4, filed on Jun. 5, 2018, the entire disclosure of which is incorporated herein by reference.

TECHNICAL FIELD

The present disclosure relates to the field of display technologies, and in particular to a fingerprint recognition substrate, a fingerprint recognition apparatus and a method for fabricating the same, a fingerprint recognition method, and a display panel.

BACKGROUND

With the progress of modern society, the importance of personal identification and personal information security has gradually attracted people's attention. Due to the uniqueness and invariance of human fingerprints, fingerprint recognition technology has the characteristics of good security, high reliability and easy and convenient to use. Therefore, fingerprint recognition technology is widely used in various fields for protecting personal information security, including display fields, especially the field of electronic device with display functions, such as mobile phones, laptops, tablets, digital cameras, and the like. Fingerprint recognition function has become one of the necessary functions for current electronic device, which is of great significance for enhancing the security of electronic device and expanding the application range thereof.

SUMMARY

The present disclosure provides a fingerprint recognition substrate, a fingerprint recognition apparatus, a method for fabricating the same, a fingerprint recognition method, and a display device.

According to an aspect of the present disclosure, a fingerprint recognition substrate is provided. The fingerprint recognition substrate including: a base substrate including a plurality of pixel regions and a region between the plurality of pixel regions; a first electrode in the plurality of pixel regions; a light emitting layer at least in the plurality of pixel regions; a second electrode at least in the plurality of pixel regions; and a plurality of light transmission holes penetrating at least the first electrodes; wherein at least one light transmission holes is in the region between the plurality of pixel regions, and the plurality of light transmission holes are configured to be optically coupled to a photosensor.

Optionally, in some embodiments, the fingerprint recognition substrate further includes a pixel defining layer; wherein the pixel defining layer includes the plurality of pixel regions and the region between the plurality of pixel regions; the pixel defining layer includes an opening, and the opening is in the pixel region; the light emitting layer is in the opening; the plurality of light transmitting holes further penetrate the pixel defining layer of the region between the plurality of pixel regions.

According to another aspect of the present disclosure, a fingerprint recognition apparatus is provided. The fingerprint recognition apparatus includes the fingerprint recognition substrate of the above embodiment. The fingerprint recognition apparatus further includes: at least one photosensor on a side of the first electrode facing away from the base substrate; an orthographic projection of the at least one photosensor on the base substrate at least partially covers an orthographic projection of at least one light transmission holes on the base substrate.

Optionally, in some embodiments, the fingerprint recognition apparatus further includes a pixel defining layer. The pixel defining layer includes the plurality of pixel regions and the region between the plurality of pixel regions; the pixel defining layer includes an opening, and the opening is in the pixel region; the light emitting layer is in the opening; the plurality of light transmitting holes further penetrate the pixel defining layer of the region between the plurality of pixel regions.

Optionally, in some embodiments, each light transmission hole is empty inside.

Optionally, in some embodiments, each light transmission hole is filled with a transparent material.

Optionally, in some embodiments, a light emitting surface of the light emitting layer faces the base substrate; the first electrode is a cathode and the second electrode is an anode.

Optionally, in some embodiments, the cathode covers the plurality of pixel regions and the region between the plurality of pixel regions.

Optionally, in some embodiments, a material of the first electrode includes a reflective material and/or a light shielding material.

Optionally, in some embodiments, an area of each light transmission hole is in a range of 1 $\mu m^2$~1 $mm^2$.

Optionally, in some embodiments, each photosensor corresponds to one light transmission hole.

Optionally, in some embodiments, each photosensor corresponds to at least two light transmission holes.

According to yet another aspect of the present disclosure, a method for fabricating a fingerprint recognition apparatus is provided. The method including: providing a fingerprint recognition substrate; the fingerprint recognition substrate including: a base substrate including a plurality of pixel regions and a region between the plurality of pixel regions; a first electrode in the plurality of pixel regions; a light emitting layer at least in the plurality of pixel regions; a second electrode at least in the plurality of pixel regions; and a plurality of light transmission holes penetrating at least the first electrode; at least one light transmission hole being in the region between the plurality of pixel regions, and the plurality of light transmission holes being configured to be optically coupled to a photosensor; and disposing at least one photosensor on a side of the first electrode facing away from the base substrate; an orthographic projection of the at least one photosensor on the base substrate at least partially covering an orthographic projection of at least one light transmission hole on the base substrate.

Optionally, in some embodiments, the fingerprint recognition apparatus further includes: a pixel defining layer; wherein the pixel defining layer includes the plurality of pixel regions and the region between the plurality of pixel regions; the pixel defining layer includes an opening, and the opening is in the pixel region; the light emitting layer is in the opening; the plurality of light transmitting holes further penetrate the pixel defining layer of the region between the plurality of pixel regions.

Optionally, in some embodiments, each light transmission hole is empty inside.

Optionally, in some embodiments, each light transmission hole is filled with a transparent material.

Optionally, in some embodiments, a light emitting surface of the light emitting layer faces the base substrate; the first electrode is a cathode and the second electrode is an anode.

Optionally, in some embodiments, the cathode covers the plurality of pixel regions and the region between the plurality of pixel regions.

Optionally, in some embodiments, a material of the first electrode includes a reflective material and/or a light shielding material.

Optionally, in some embodiments, providing the fingerprint recognition substrate includes: forming a planar electrode by using an evaporation process; and forming a plurality of light transmission holes penetrating the pixel defining layer and the planar electrode by using a laser ablation process.

Optionally, in some embodiments, providing the fingerprint recognition substrate includes: performing an evaporation process using a mask having a light transmission hole pattern to form a planar electrode having light transmission holes.

According to still another aspect of the present disclosure, a fingerprint recognition method using the fingerprint recognition apparatus of the above embodiments is provided. The method including: using the fingerprint recognition substrate to emit light to a side of the fingerprint recognition substrate facing away from the at least one photosensor; transmitting reflected light by means of the plurality of light transmission holes; and detecting the reflected light by the at least one photosensor.

According to yet another aspect of the present disclosure, a display device is provided. The display device includes the fingerprint recognition apparatus of the above embodiments.

BRIEF DESCRIPTION OF THE DRAWINGS

In order to more clearly illustrate the technical solutions in embodiments of the disclosure or prior art, the appended drawings needed to be used in the description of the embodiments or the prior art will be briefly introduced below. Obviously, the drawings in the following description are only some embodiments of the disclosure, and for those of skilled in the art, other drawings may be obtained according to these drawings without creative work.

DETAILED DESCRIPTION OF THE DISCLOSURE

In the following, the technical solutions in the embodiments of the disclosure will be clearly and completely described in connection with the drawings in the embodiments of the disclosure. Obviously, the described embodiments are only part of the embodiments of the disclosure, rather than all embodiments. Based on the embodiments in the disclosure, all other embodiments obtained by those of skilled in the art without creative efforts are all within the protection scope of the disclosure.

According to an aspect of the present disclosure, a fingerprint recognition substrate is provided. As shown in FIGS. 1-4, the fingerprint recognition substrate includes: a base substrate 101 including a plurality of pixel regions 10 and a region between the plurality of pixel regions 10; a first electrode 1031 in a plurality of pixel regions; and a light emitting layer 1032 at least in the plurality of pixel regions 10; a second electrode 1033 at least in the plurality of pixel regions 10; and a plurality of light transmission holes 105 at least penetrating the first electrodes 10; wherein at least one light transmission hole 105 is at the region between the plurality of pixel regions 10, and the plurality of light transmitting holes 105 are configured to be optically coupled to a photosensor 104.

Optionally, in some embodiments, the fingerprint recognition substrate further comprises: a pixel defining layer 1034; wherein the pixel defining layer 1034 includes the plurality of pixel regions 10 and the region between the plurality of pixel regions 10; the pixel defining layer 1034 includes an opening in the pixel region 10; the light emitting layer 1032 is in the opening; the plurality of light transmitting holes 105 further penetrates the pixel defining layer 1034 of the region between the plurality of pixel regions 10.

According to another aspect of the present disclosure, a fingerprint recognition apparatus is provided. As shown in FIGS. 1-4, the fingerprint recognition apparatus includes: the fingerprint recognition substrate described in the above embodiment; the fingerprint recognition apparatus further includes: at least one photosensor 104 on the side of the first electrode 1031 facing away from the base substrate 101; an orthographic projection of the at least one photosensor 104 on the base substrate 101 at least partially covers an orthographic projection of at least one light transmission holes 105 on the base substrate 101.

In an embodiment of the present disclosure, at least one photosensor 104 is disposed on a side of the first electrode 1031 facing away from the base substrate 101. After the light emitted by the electroluminescent element 103 passes through the base substrate 101, it may be reflected by an object 106 to be identified (e.g., a fingerprint) on the side of the base substrate 101 facing away from the light emitting layer 1032. By means of the light transmission holes 105 provided in the region between the plurality of pixel regions, the reflected light (shown by a dotted line arrow in FIG. 2) may reach the photosensor 104, thereby realizing the fingerprint recognition apparatus with a simple configuration.

Optionally, in some embodiments, the fingerprint recognition substrate further includes: a pixel defining layer 1034; wherein the pixel defining layer 1034 includes the plurality of pixel regions 10 and the region between the plurality of pixel regions 10; the pixel defining layer 1034 includes an opening in the pixel region 10; the light emitting layer 1032 is in the opening; the plurality of light transmitting holes 105 further penetrates the pixel defining layer 1034 of the region between the plurality of pixel regions 10.

Figure 1:
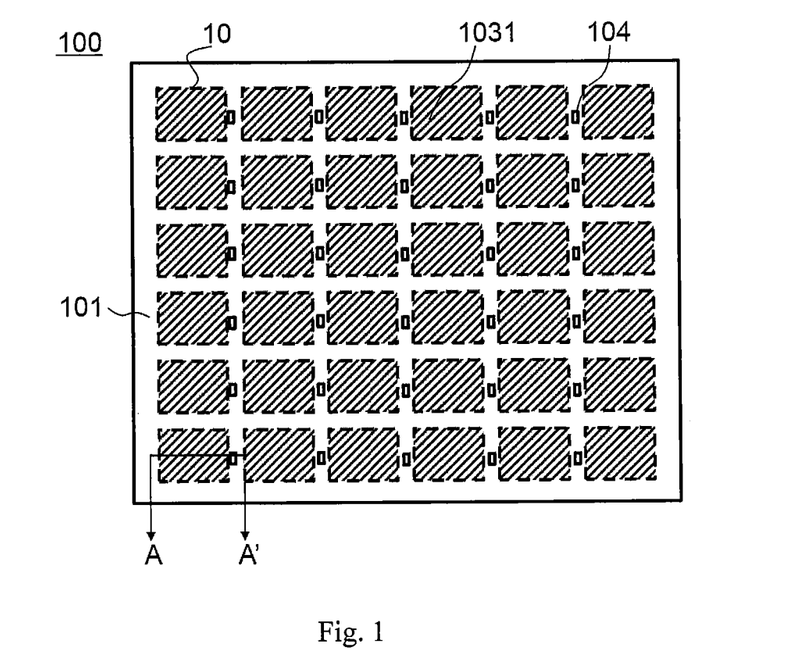
FIG. 1 is a top view of a fingerprint recognition apparatus in accordance with an embodiment of the present disclosure.
Figure 2:
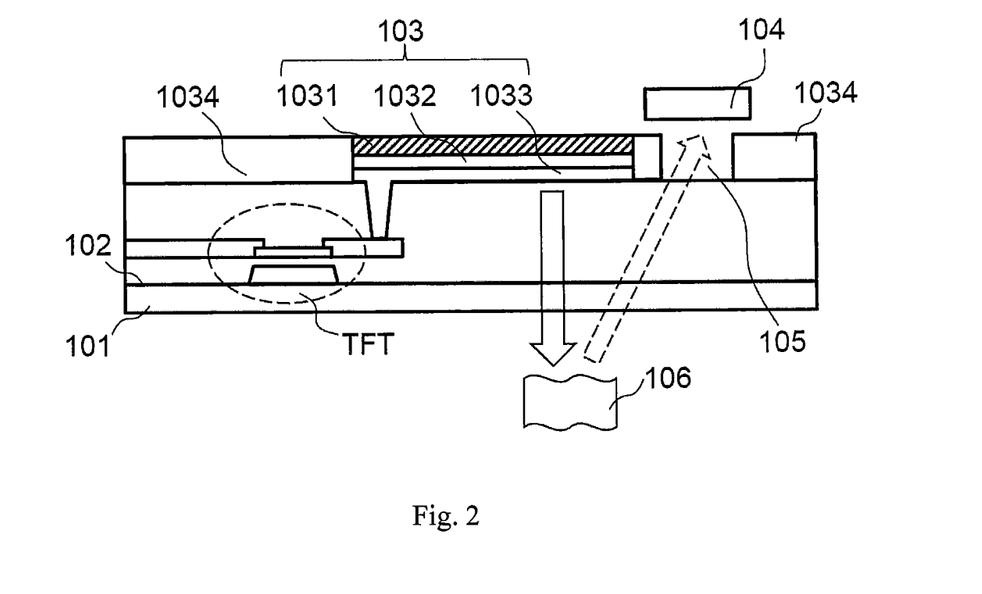
FIG. 2 is a cross-sectional view of the fingerprint recognition apparatus shown in FIG. 1 taken along line A-A'.
Figure 4:
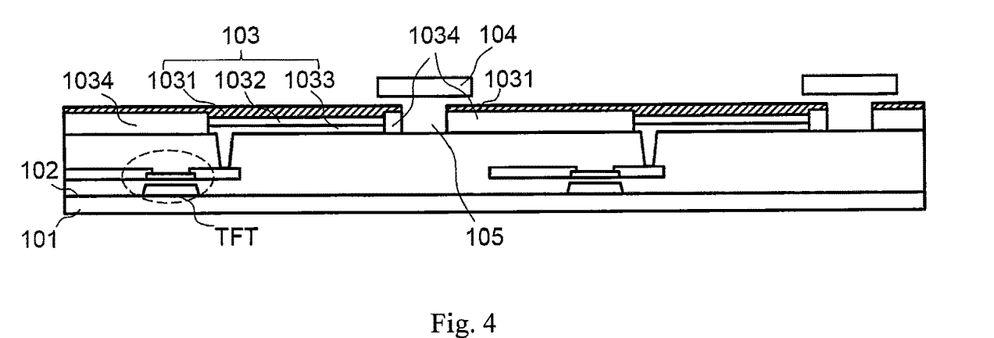
FIG. 4 is a cross-sectional view of the fingerprint recognition apparatus shown in FIG. 3 taken along line B-B'.
Figure 5:
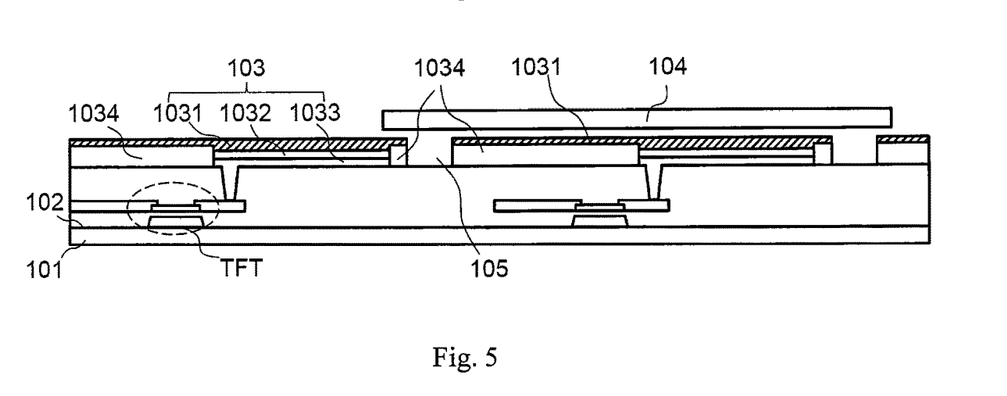
FIG. 5 is a cross-sectional view of a fingerprint recognition apparatus according to another embodiment of the present disclosure.

In some embodiments, each light transmission hole 105 at least penetrates the pixel defining layer 1034 (as shown in FIGS. 2, 4, and 5), so that light may be transmitted from the bottom of the base substrate 101 to the photosensor 104.

Optionally, in some embodiments, each light transmission hole 105 is empty inside.

Optionally, in some embodiments, each light transmission hole 105 is filled with a transparent material.

Optionally, as shown in FIG. 2, in some embodiments, the light emitting surface of the light emitting layer 1032 faces the base substrate 101; the first electrode 1031 is a cathode, and the second electrode 1033 is an anode.

In some embodiments, the anode (i.e., the second electrode) of each electroluminescent element is closer to the base substrate than the cathode (i.e., the first electrode), and the light emitting surface of each electroluminescent element faces the base substrate. Therefore, the electroluminescent element is a bottom emission type light emitting device. In the bottom emission type light emitting device, the cathode may be made of a light shielding material or a reflective material. Therefore, there is no need to arrange an additional light shielding layer between the cathode and the photosensor, which simplifies the fabrication process and structure.

Those skilled in the art will appreciate that the electroluminescent element may also be a double-sided or top emission electroluminescent element. In this case, it is necessary to further cover a light shielding layer above the cathode and to provide an opening corresponding to the light transmission hole 105 in the light shielding layer. Such an arrangement would add at least one mask process.

Figure 3:
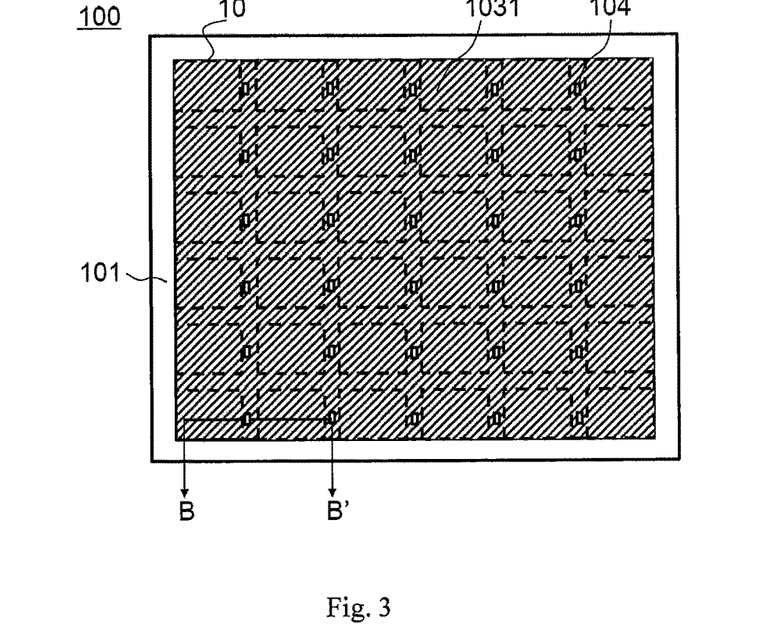
FIG. 3 is a top view of a fingerprint recognition apparatus in accordance with another embodiment of the present disclosure.

Alternatively, as shown in FIGS. 3 and 4, in some embodiments, the cathode 1031 covers the plurality of pixel regions 10 and the region between the plurality of pixel regions 10.

In some embodiments, a planar electrode is shared by the plurality of electroluminescent elements as a cathode for each electroluminescent element. A cathode electrical connection may be provided to the plurality of electroluminescent elements using a planar cathode that spans the fingerprint recognition apparatus. Moreover, providing the light transmission holes on the planar cathode does not significantly affect the voltage uniformity and electrical characteristics on the planar cathode.

Corresponding to the design of the planar cathode, in some embodiments, each electroluminescent element includes a pixel defining layer 1034 having an opening, the light emitting layer 1032 being within the opening; each light transmission hole 105 at least penetrating the pixel defining layer 1034 and the planar cathode (as shown in FIGS. 4 and 5). Thereby, light may be transmitted from the bottom of the base substrate 101 to the photosensor 104.

Optionally, in some embodiments, a material of the first electrode 1031 includes a reflective material and/or a light shielding material.

In some embodiments, by using a reflective cathode, the light extraction efficiency of the electroluminescent element is increased. More light is reflected by the cathode to the object to be identified (e.g., fingerprint), which also increases the sensitivity of fingerprint recognition. Those skilled in the art will appreciate that the first electrode may also be made of a light shielding material.

Optionally, in some embodiments, the area of each light transmission hole is in the range of 1 $\mu m^2$~1 $mm^2$.

In some embodiments, the area of each light transmission hole is in the range of 1 $\mu m^2$~1 $mm^2$, whereby biometrics such as fingerprints, palmprints, and the like may be accurately identified (or detected).

Optionally, as shown in FIGS. 2 and 4, in some embodiments, each photosensor 104 corresponds to one light transmission hole 105.

In some embodiments, each photosensor corresponds to one light transmission hole, which may achieve better fingerprint recognition accuracy.

Similarly, in some embodiments, as shown in FIG. 5, each photosensor 104 may also correspond to at least two light transmission holes 105 to achieve better sensitivity in low light conditions.

Optionally, in some embodiments, the electroluminescent element 103 is an electroluminescent diode.

In some embodiments, the electroluminescent element is an electroluminescent diode. The electroluminescent diode may be an organic electroluminescent diode (OLED) or a quantum dot light emitting diode (QLED). The electroluminescent diode may be driven by, for example, a thin film transistor TFT as shown in FIG. 2. The anode 1033 may be connected to the drain of the thin film transistor TFT, for example, through a via. Those skilled in the art will appreciate that the electroluminescent element may also be a device such as a light emitting diode, a laser diode or the like.

According to yet another aspect of the present disclosure, a method of fabricating a fingerprint recognition apparatus is provided. The method includes the following steps.

A fingerprint recognition substrate is provided (S1). The fingerprint recognition substrate includes: a base substrate including a plurality of pixel regions and a region between the plurality of pixel regions; a first electrode in a plurality of pixel regions; a light emitting layer at least in a plurality of pixel regions; a second electrode at least in a plurality of pixel regions; and a plurality of light transmission holes penetrating at least the first electrodes; at least one light transmission hole being in the region between the plurality of pixel regions, and the plurality of light transmission holes being configured to be optically coupled to a photosensor; and disposing at least one photosensor on a side of the first electrode facing away from the base substrate (S2); an orthographic projection of the at least one photosensor on the base substrate at least partially covering an orthographic projection of at least one light transmission hole on the base substrate.

In an embodiment of the present disclosure, at least one photosensor is disposed on a side of the first electrode facing away from the substrate. After the light emitted by the light emitting layer passes through the base substrate, it may be reflected by an object to be recognized (e.g., a fingerprint) on a side of the base substrate facing away from the light emitting layer 1032. The reflected light may reach the photosensor by means of the light transmission holes provided in the region between the plurality of pixel regions, thereby realizing the fingerprint recognition apparatus with a simple configuration.

Optionally, as shown in FIGS. 2, 4, and 5, in some embodiments, the fingerprint recognition apparatus further includes: a pixel defining layer; wherein the pixel defining layer includes the plurality of pixel regions and the region between the plurality of pixel regions; the pixel defining layer includes an opening in the pixel region; the light emitting layer is in the opening; the plurality of light transmitting holes further penetrates the pixel defining layer of the region between the plurality of pixel regions.

In some embodiments, each light transmission holes 105 at least penetrates the pixel defining layer 1034 (as shown in FIGS. 2, 4, and 5), so that light may be transmitted from the bottom of the base substrate 101 to the photosensor 104.

Optionally, in some embodiments, each light transmission hole is empty inside.

Optionally, in some embodiments, each light transmission hole is filled with a transparent material.

Optionally, as shown in FIG. 2, in some embodiments, the light emitting surface of the light emitting layer 1032 faces the base substrate 101; the first electrode 1031 is a cathode, and the second electrode 1033 is an anode.

In some embodiments, the anode (i.e., the second electrode) of each electroluminescent element is closer to the base substrate than the cathode (i.e., the first electrode), and the light emitting surface of each electroluminescent element faces the base substrate. Therefore, the electroluminescent element is a bottom emission type light emitting device. In the bottom emission type light emitting device, the cathode may be made of a light shielding material or a reflective material. Therefore, there is no need to arrange an additional light shielding layer between the cathode and the photosensor, which simplifies the fabrication process and structure.

Those skilled in the art will appreciate that the electroluminescent element may also be a double-sided or top emission electroluminescent element. In this case, it is necessary to further cover a light shielding layer above the cathode and to provide an opening corresponding to the light transmission hole 105 in the light shielding layer. Such an arrangement would add at least one mask process.

Alternatively, as shown in FIGS. 3 and 4, in some embodiments, the cathode 1031 covers the plurality of pixel regions 10 and the region between the plurality of pixel regions 10.

In some embodiments, a planar electrode is shared by the plurality of electroluminescent elements as a cathode for each electroluminescent element. A cathode electrical connection may be provided to the plurality of electroluminescent elements using a planar cathode that spans the fingerprint recognition apparatus. Moreover, providing the light transmission holes on the planar cathode does not significantly affect the voltage uniformity and electrical characteristics on the planar cathode.

Corresponding to the design of the planar cathode, in some embodiments, each electroluminescent element includes a pixel defining layer 1034 having an opening, the light emitting layer 1032 being within the opening; each light transmission holes 105 at least penetrating the pixel defining layer 1034 and the planar cathode (as shown in FIGS. 4 and 5). Thereby, light may be transmitted from the bottom of the base substrate 101 to the photosensor 104.

Optionally, in some embodiments, a material of the first electrode 1031 includes a reflective material and/or a light shielding material.

In some embodiments, by using a reflective cathode, the light extraction efficiency of the electroluminescent element is increased. More light is reflected by the cathode to the object to be identified (e.g., fingerprint), which also increases the sensitivity of fingerprint recognition. Those skilled in the art will appreciate that the first electrode may also be made of a light shielding material.

In some embodiments, a planar electrode is shared by the plurality of electroluminescent elements as a cathode for each electroluminescent element. A cathode electrical connection may be provided to the plurality of electroluminescent elements using a planar cathode that spans the fingerprint recognition apparatus. Moreover, providing the light transmission holes on the planar cathode does not significantly affect the voltage uniformity and electrical characteristics on the planar cathode.

Figure 6A:
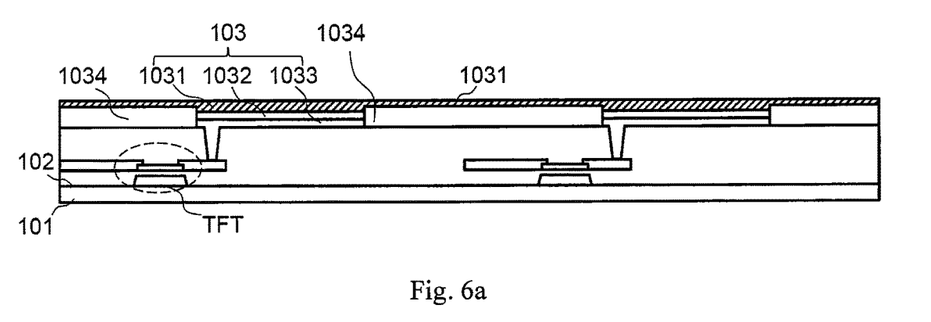
FIGS. 6a-6b are schematic structural views of respective steps of a method for fabricating a fingerprint recognition apparatus corresponding to an embodiment of the present disclosure.
Figure 6B:
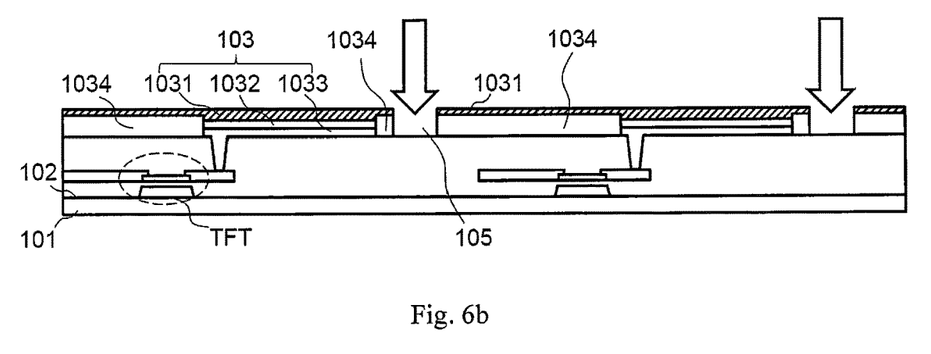

Optionally, as shown in FIGS. 6a and 6b, in some embodiments, providing the fingerprint recognition substrate includes: forming a planar electrode 1031 by using an evaporation process (as shown in FIG. 6a); and forming a plurality of light transmission holes penetrating the pixel defining layer 1034 and the planar electrode 1031 by using a laser ablation process (as shown in FIG. 6b).

Figure 7A:
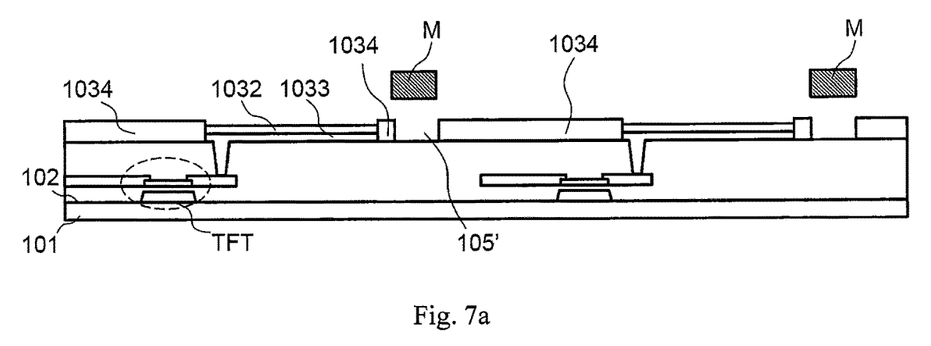
FIGS. 7a-7b are schematic structural views of respective steps of a method for fabricating a fingerprint recognition apparatus corresponding to another embodiment of the present disclosure.
Figure 7B:
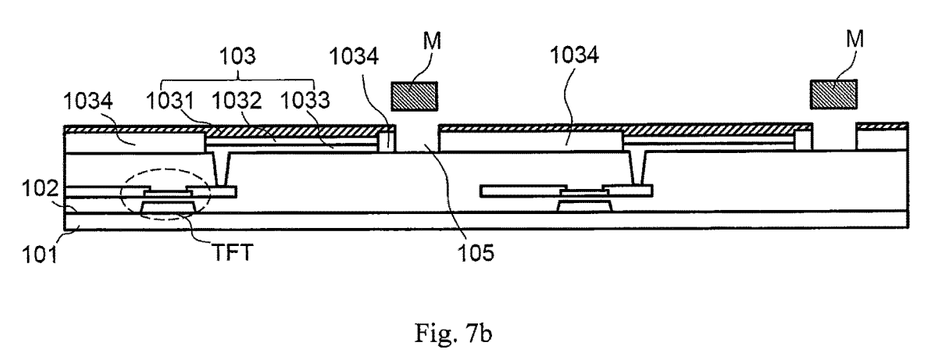

Optionally, in some embodiments, providing the fingerprint recognition substrate includes: performing an evaporation process by using a mask M having a light transmission hole pattern (as shown in FIG. 7a), thereby forming a planar electrode 1031 having the light transmission holes 105 (as shown in FIG. 7b).

As shown in FIG. 7a, the pixel defining layer 1034 and a light transmission holes 105' penetrating the pixel defining layer 1034 may be formed by etching or evaporation. Then, a planar electrode having light transmission holes may be formed at one time by using, for example, an FMM (Fine Metal Mask), thereby simplifying the manufacturing process. The evaporation material for the cathode may be a material such as Al, and the thickness of the cathode may be in the range of 1500-2200 Å.

Corresponding to the design of the planar cathode, in some embodiments, each electroluminescent element includes a pixel defining layer 1034 having an opening, the light emitting layer 1032 being within the opening; each light transmission holes 105 at least penetrating the pixel defining layer 1034 and the planar cathode (as shown in FIGS. 4 and 5). Thereby, light may be transmitted from the bottom of the base substrate 101 to the photosensor 104.

Optionally, as shown in FIGS. 2 and 4, in some embodiments, each photosensor 104 corresponds to one light transmission hole 105.

In some embodiments, each photosensor corresponds to one light transmission hole, which may achieve better fingerprint recognition accuracy.

Similarly, in some embodiments, as shown in FIG. 5, each photosensor 104 may also correspond to at least two light transmission holes 105 to achieve better sensitivity in low light conditions.

Optionally, in some embodiments, the electroluminescent element 103 is an electroluminescent diode.

In some embodiments, the electroluminescent element is an electroluminescent diode. The electroluminescent diode may be an organic electroluminescent diode (OLED) or a quantum dot light emitting diode (QLED). The electroluminescent diode may be driven by, for example, a thin film transistor TFT as shown in FIG. 2. The anode 1033 may be connected to the drain of the thin film transistor TFT, for example, through a via. Those skilled in the art will appreciate that the electroluminescent element may also be a device such as a light emitting diode, a laser diode or the like.

According to still another aspect of the present disclosure, a fingerprint recognition method using the fingerprint recognition apparatus of the above embodiment is provided. The method including: using the fingerprint recognition substrate to emit light to a side of the fingerprint recognition substrate facing away from the at least one photosensor;

transmitting reflected light by means of the plurality of light transmission holes; and detecting the reflected light by the at least one photosensor.

In an embodiment of the present disclosure, at least one photosensor is disposed on a side of the first electrode facing away from the substrate. After the light emitted by the light emitting layer passes through the base substrate, it may be reflected by an object to be recognized (e.g., a fingerprint) on a side of the base substrate facing away from the light emitting layer. The reflected light may reach the photosensor by means of the light transmission hole provided in the region between the plurality of pixel regions, thereby realizing the fingerprint recognition with a simple configuration.

According to still another aspect of the present disclosure, a display device is provided. The display device includes a fingerprint recognition apparatus as described in the above embodiments. The display device may be any product or component having a display function, such as a mobile phone, a tablet, a television, a display, a laptop, a digital photo frame, a navigator, and the like. For the implementation of the display device, reference may be made to the embodiments of the fingerprint recognition apparatus described above, and will not be repeated herein.

In an embodiment of the present disclosure, at least one photosensor is disposed on a side of the first electrode facing away from the substrate. After the light emitted by the light emitting layer passes through the base substrate, it may be reflected by an object to be recognized (e.g., a fingerprint) on a side of the base substrate facing away from the light emitting layer. The reflected light may reach the photosensor by the light transmission hole provided in the region between the plurality of pixel regions, thereby realizing the fingerprint recognition apparatus with a simple configuration.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

What is claimed is:

1. A fingerprint recognition substrate, comprising:
   a base substrate comprising a plurality of pixel regions and a region between the plurality of pixel regions;
   a first electrode in the plurality of pixel regions;
   a light emitting layer in the plurality of pixel regions;
   a second electrode in the plurality of pixel regions; and
   a plurality of light transmission holes penetrating the first electrode,
   wherein at least one of the plurality of light transmission holes is in the region between the plurality of pixel regions, and the plurality of light transmission holes are configured to be optically coupled to a photosensor, and
   wherein the first electrode is a planar electrode covering the plurality of pixel regions and shared by the plurality of pixel regions.

2. The fingerprint recognition substrate according to claim 1, further comprising:
   a pixel defining layer,
   wherein the pixel defining layer includes the plurality of pixel regions and the region between the plurality of pixel regions,
   wherein the pixel defining layer comprises an opening, and the opening is in a pixel region of the plurality of pixel regions,
   wherein the light emitting layer is in the opening, and
   wherein the plurality of light transmitting holes further penetrate the pixel defining layer of the region between the plurality of pixel regions.

3. A fingerprint recognition apparatus comprising the fingerprint recognition substrate of claim 1, further comprising:
   at least one photosensor comprising the photosensor on a side of the first electrode facing away from the base substrate,
   wherein an orthographic projection of the at least one photosensor on the base substrate at least partially overlaps an orthographic projection of at least one of the plurality of light transmission holes on the base substrate.

4. The fingerprint recognition apparatus according to claim 3, further comprising:
   a pixel defining layer,
   wherein the pixel defining layer includes the plurality of pixel regions and the region between the plurality of pixel regions,
   wherein the pixel defining layer comprises an opening, and the opening is in a pixel region of the plurality of pixel regions,
   wherein the light emitting layer is in the opening, and
   wherein the plurality of light transmitting holes further penetrate the pixel defining layer of the region between the plurality of pixel regions.

5. The fingerprint recognition apparatus according to claim 4, wherein each of the plurality of light transmission holes is empty inside or filled with a transparent material.

6. The fingerprint recognition apparatus according to claim 3,
   wherein a light emitting surface of the light emitting layer faces the base substrate, and
   wherein the first electrode comprises a cathode and the second electrode comprises an anode.

7. The fingerprint recognition apparatus according to claim 6, wherein the cathode overlaps the plurality of pixel regions and the region between the plurality of pixel regions.

8. The fingerprint recognition apparatus according to claim 3, wherein a material of the first electrode comprises at least one of a reflective material or a light shielding material.

9. The fingerprint recognition apparatus according to claim 3, wherein an area of each of the plurality of light transmission holes is in a range of 1 $\mu m^2$~1 $mm^2$.

10. The fingerprint recognition apparatus according to claim 3, wherein each photosensor of the at least one photosensor corresponds to one light transmission hole of the plurality of light transmission holes.

11. A method for fabricating a fingerprint recognition apparatus, comprising:
    providing a fingerprint recognition substrate the fingerprint recognition substrate comprising:
      a base substrate comprising a plurality of pixel regions and a region between the plurality of pixel regions;
      a first electrode in the plurality of pixel regions;
      a light emitting layer in the plurality of pixel regions;
      a second electrode in the plurality of pixel regions; and
      a plurality of light transmission holes penetrating the first electrode, wherein at least one of the plurality of light transmission holes is in the region between the plurality of pixel regions, and wherein the plurality of light transmission holes are configured to be optically coupled to a photosensor; and disposing at least one photosensor comprising the photosensor on a side of the first electrode facing away from the base substrate, wherein an orthographic projection of the at least one photosensor on the base substrate at least partially overlaps an orthographic projection of the at least one of the plurality of light transmission holes on the base substrate, and wherein the first electrode is a planar electrode covering the plurality of pixel regions and shared by the plurality of pixel regions.

12. The method according to claim 11, wherein the fingerprint recognition apparatus further comprises:

a pixel defining layer, wherein the pixel defining layer includes the plurality of pixel regions and the region between the plurality of pixel regions, wherein the pixel defining layer comprises an opening, and the opening is in a pixel region of the plurality of pixel regions, wherein the light emitting layer is in the opening, and wherein the plurality of light transmitting holes further penetrate the pixel defining layer of the region between the plurality of pixel regions.

13. The method according to claim 12, wherein each of the plurality of light transmission holes is empty inside or filled with a transparent material.

14. The method according to claim 11, wherein a light emitting surface of the light emitting layer faces the base substrate, and wherein the first electrode comprises a cathode and the second electrode comprises an anode.

15. The method according to claim 14, wherein the cathode overlaps the plurality of pixel regions and the region between the plurality of pixel regions.

16. The method according to claim 11, wherein a material of the first electrode comprises at least one of a reflective material or a light shielding material.

17. The method according to claim 16, wherein providing the fingerprint recognition substrate comprises:

forming the planar electrode by using an evaporation process; and forming the plurality of light transmission holes penetrating a pixel defining layer and the planar electrode by using a laser ablation process.

18. The method according to claim 16, wherein providing the fingerprint recognition substrate comprises:

performing an evaporation process using a mask having a light transmission hole pattern to form the planar electrode having the plurality of light transmission holes.

19. A fingerprint recognition method using the fingerprint recognition apparatus according to claim 3, comprising:

using the fingerprint recognition substrate to emit light to a side of the fingerprint recognition substrate facing away from the at least one photosensor;

transmitting reflected light through the plurality of light transmission holes; and detecting the reflected light by the at least one photosensor.

20. A display device, comprising the fingerprint recognition apparatus according to claim 3.

* * * * *